(12) United States Patent
Cai

(10) Patent No.: US 9,747,037 B2
(45) Date of Patent: *Aug. 29, 2017

(54) EXTENDED-HEIGHT DIMM

(71) Applicant: RAMBUS INC., Sunnyvale, CA (US)

(72) Inventor: Victor Cai, Pasadena, CA (US)

(73) Assignee: Rambus Inc., Sunnyvale, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 14/951,377

(22) Filed: Nov. 24, 2015

(65) Prior Publication Data

US 2016/0132238 A1    May 12, 2016

Related U.S. Application Data

(63) Continuation of application No. 13/530,647, filed on Jun. 22, 2012, now Pat. No. 9,196,314.

(60) Provisional application No. 61/501,083, filed on Jun. 24, 2011.

(51) Int. Cl.
| | |
|---|---|
| *G06F 1/18* | (2006.01) |
| *G06F 3/06* | (2006.01) |
| *G11C 5/04* | (2006.01) |
| *G11C 11/4076* | (2006.01) |

(Continued)

(52) U.S. Cl.
CPC .............. *G06F 3/061* (2013.01); *G06F 1/185* (2013.01); *G06F 3/0629* (2013.01); *G06F 3/0683* (2013.01); *G11C 5/04* (2013.01); *G11C 11/4076* (2013.01); *G11C 11/4082* (2013.01); *G11C 11/4093* (2013.01)

(58) Field of Classification Search
CPC ........ G06F 3/061; G06F 1/185; G06F 3/0629; G06F 3/0683; G11C 5/04; G11C 11/4076; G11C 11/4082; G11C 11/4093
See application file for complete search history.

(56) References Cited

U.S. PATENT DOCUMENTS 8,898,368 B2 * 11/2014 Haywood ................ G11C 5/04
710/305
9,170,878 B2 * 10/2015 Haywood ............. G06F 11/073
(Continued)

OTHER PUBLICATIONS

"Jedec Document, MO-269H", Jun. 15, 2011. pp. 1-24.

*Primary Examiner* — Hoa C Nguyen
*Assistant Examiner* — Keith Depew
(74) *Attorney, Agent, or Firm* — Lowenstein Sandler LLP

(57) ABSTRACT

An extended-height DIMM for use in a memory system having slots designed to receive DIMMs that comply with a JEDEC standard that specifies a maximum height for the DIMM and a maximum number of devices allowed to reside on the DIMM. The DIMM comprises a PCB having an edge connector designed to mate with a memory system slot and a height which is greater than the maximum height specified in the applicable standard, a plurality of memory devices which exceeds the maximum number of devices specified in the applicable standard, and a memory buffer, or a register control device and data buffers, which operates as an interface between a host controller's data and command/address busses and the memory devices. This arrangement enables the extended-height DIMM to provide greater memory capacity than would a DIMM which complies with the maximum height and maximum number of devices limits.

15 Claims, 2 Drawing Sheets

(51) Int. Cl.
*G11C 11/408* (2006.01)
*G11C 11/4093* (2006.01)

(56) References Cited

U.S. PATENT DOCUMENTS

| | | | | |
|---|---|---|---|---|
| 2002/0163784 A1* | 11/2002 | Dong | ............... | G11C 5/06 |
| | | | | 361/728 |
| 2003/0090879 A1* | 5/2003 | Doblar | ............... | G11C 5/04 |
| | | | | 361/728 |
| 2006/0053345 A1* | 3/2006 | Goodwin | ............... | H05K 1/189 |
| | | | | 714/42 |
| 2006/0203442 A1* | 9/2006 | Goodwin | ............... | G11C 5/04 |
| | | | | 361/679.32 |
| 2007/0195613 A1* | 8/2007 | Rajan | ............... | G11C 7/1045 |
| | | | | 365/189.05 |
| 2008/0030943 A1* | 2/2008 | Kim | ............... | G11C 5/04 |
| | | | | 361/679.31 |
| 2008/0123305 A1* | 5/2008 | Amidi | ............... | G11C 5/02 |
| | | | | 361/737 |
| 2010/0309706 A1* | 12/2010 | Saito | ............... | G11C 5/04 |
| | | | | 365/51 |
| 2012/0311249 A1 | 12/2012 | Koya | ............... | 711/105 |
| 2013/0042127 A1 | 2/2013 | Thomas et al. | ............... | 713/323 |

* cited by examiner

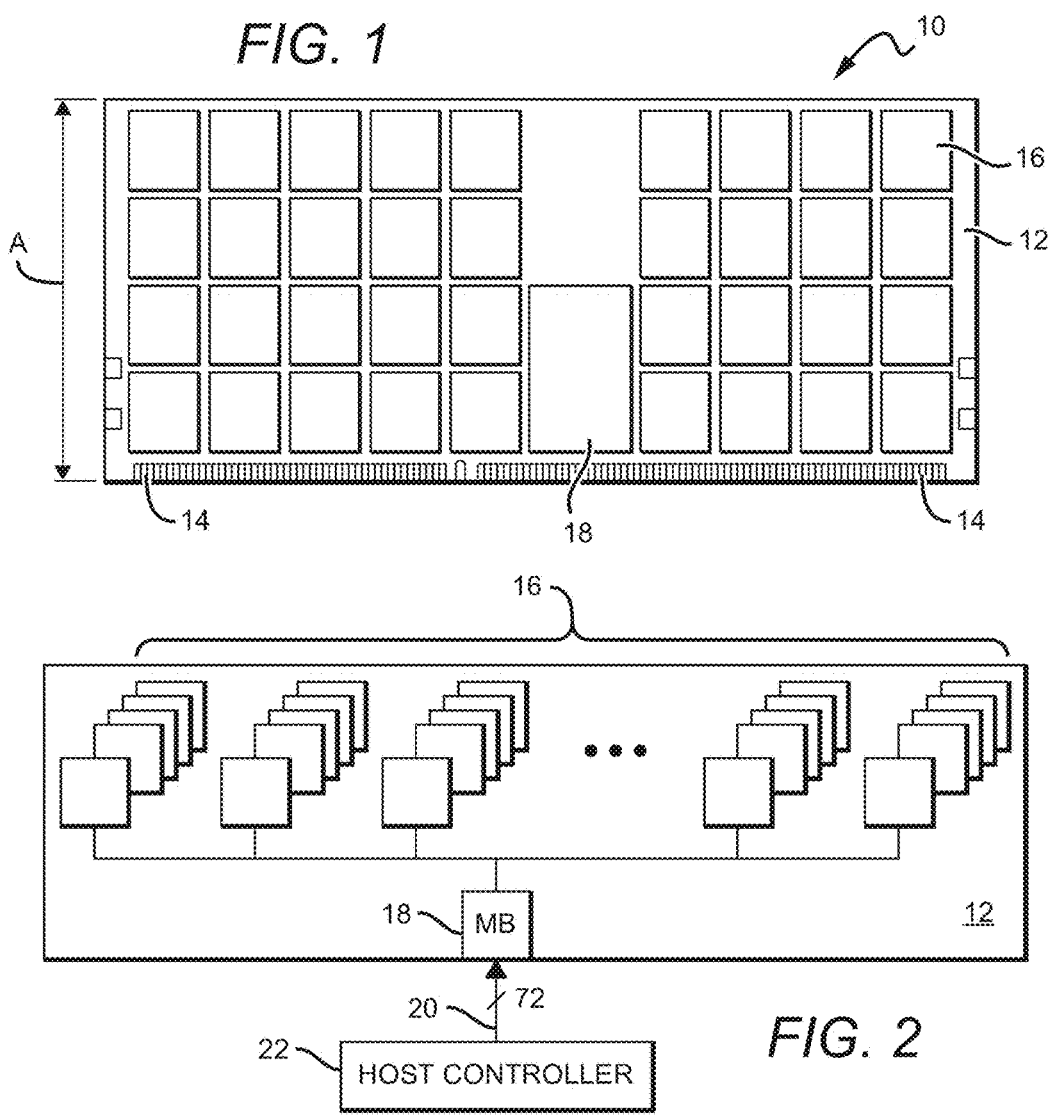
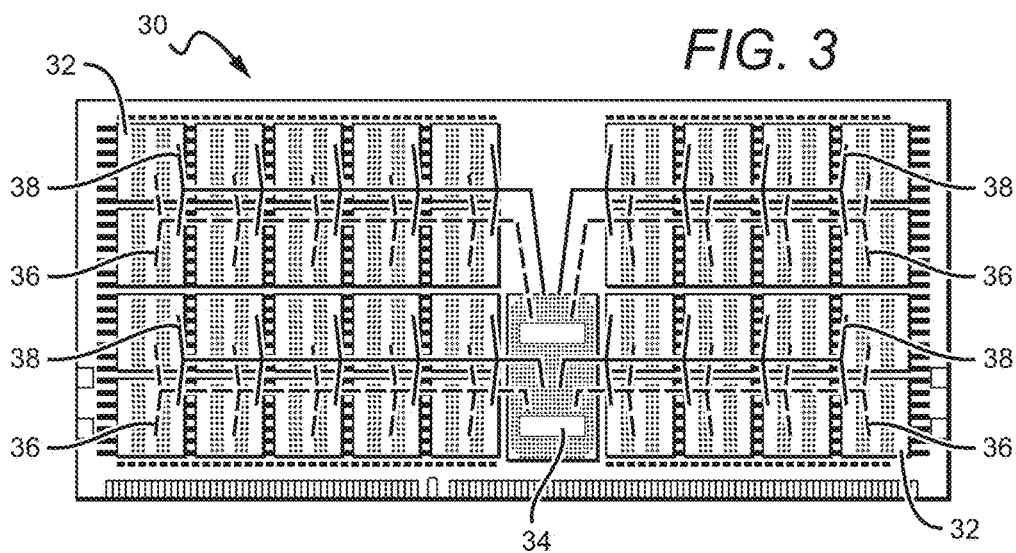

EXTENDED-HEIGHT DIMM

RELATED APPLICATIONS

This application is a Continuation-in-Part of U.S. patent application Ser. No. 13/530,647 to Victor Cai, filed Jun. 22, 2012, still pending, which claimed the benefit of provisional patent application No. 61/501,083 to Victor Cai, filed Jun. 24, 2011.

BACKGROUND OF THE INVENTION

Field of the Invention

This invention relates generally to dual-inline memory modules (DIMMs), and more particularly to the physical characteristics of such DIMMs.

Description of the Related Art

Conventional computer memory systems provide random access memory by means of dual-inline memory modules (DIMMs), which are plugged into respective slots on the computer's motherboard. A number of individual RAM chips—typically dynamic RAM (DRAM)—reside on each DIMM.

The physical and electrical characteristics of a given DIMM module are governed by various industry standards documents, typically those promulgated by the Joint Electron Device Engineering Council (JEDEC). For example, a set of JEDEC standards governing the characteristics of a DDR3 SDRAM DIMM specifies that the DIMM module have a height that is no greater than approximately 30 mm; such a DIMM can accommodate up to two rows of DRAMs.

This height limitation imposes a limit on the DIMM's memory capacity. One way of overcoming this limitation is to use 'stacked' DRAM chips, each of which consists of two or more DRAM circuits within a single DRAM package, instead of conventional non-stacked (planar) DRAMs. However, stacked DRAMs tend to be both more expensive and less reliable than conventional DRAMs.

SUMMARY OF THE INVENTION

The present invention is directed to an 'extended-height' DIMM, which provides increased memory capacity when compared with a conventional DIMM.

The new extended-height DIMM is for use in a memory system having slots designed to receive DIMMs that comply with a JEDEC standard that specifies a maximum height for the DIMM and a maximum number of devices allowed to reside on the DIMM. The DIMM comprises:

a printed circuit board (PCB) having an edge connector designed to mate with the memory system slots, the height of the PCB being greater than the maximum height specified in the applicable standard;

a plurality of memory devices on the PCB (typically DRAMs) which exceeds the maximum number of devices specified in the applicable standard; and a register control device (RCD) and multiple data buffers (DBs) on the PCB arranged to operate as an interface between a host controller's data and command/address busses and all of the DIMM's memory devices;

such that the extended-height DIMM provides greater memory capacity than would a DIMM which complies with the maximum height and maximum number of devices limits The present extended-height DIMM can be used in at least two ways. Since it can accommodate a greater number of DRAMs, an extended-height DIMM can be populated with conventional non-stacked (planar) DRAMs and still provide a memory capacity that would otherwise require the use of stacked DRAMs on a standard DIMM. Alternatively, the extended-height DIMM could be populated with stacked DRAMs, providing even greater memory capacity.

These and other features, aspects, and advantages of the present invention will become better understood with reference to the following description and claims.

BRIEF DESCRIPTION OF THE DRAWINGS

FIG. 1 is an illustration of one possible embodiment of an extended-height DIMM in accordance with the present invention.

FIG. 2 is a block diagram of one embodiment of an extended-height DIMM in accordance with the present invention.

FIG. 3 is an illustration of an extended-height DIMM in accordance with the present invention, which indicates the flow of commands and data between a memory buffer and the DIMM's DRAM chips.

DETAILED DESCRIPTION OF THE INVENTION

Figure 4:
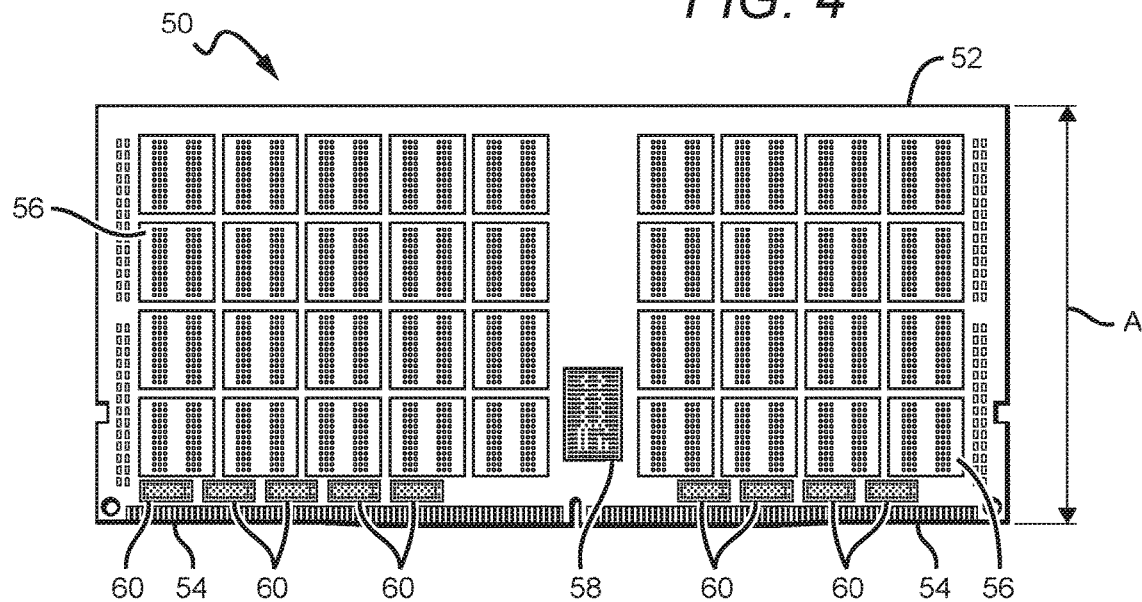
FIG. 4 is an illustration of another possible embodiment of an extended-height DIMM in accordance with the present invention.

The present extended-height DIMM is for use in a memory system having slots designed to receive DIMMs that comply with a JEDEC standard that specifies a maximum height for the DIMM and the maximum number of devices allowed to reside on the DIMM; an exemplary embodiment of such a DIMM is shown in FIG. 1. The DIMM 10 comprises a PCB 12 having an edge connector 14 designed to mate with a respective one of the memory system's slots (not shown).

The height 'A' of the PCB is greater than the maximum height imposed by the JEDEC specification governing that type of DIMM. For example, JEDEC document MO-269 (dated Jun. 15, 2011) specifies that the nominal height of a standard DDR3 SDRAM DIMM is to be approximately 30 mm The height of the present extended-height DIMM is greater than 30 mm, and is preferably 56 mm (though other heights might also be used).

A plurality of memory devices 16 reside on PCB 12, with the number of devices exceeding the maximum number of devices specified in the applicable governing standard. For example, the DDR3 SDRAM DIMM discussed above can accommodate two rows of memory devices (typically DRAM chips) on each side of the PCB, with each row holding a maximum of 9 devices, for a maximum of 36 devices. In contrast, the present extended-height DIMM is preferably arranged to accommodate more than two rows of devices—preferably four rows—on each side of the PCB. Assuming that the DRAMs are sized such that nine devices fit in each row, and there are four rows on each side, the extended-height DIMM can accommodate a maximum of 72 devices.

The present extended-height DIMM also includes a memory buffer (MB) 18 on PCB 12, which is used to buffer data bytes being written to or read from memory devices 16 by a host controller, as well as operate as a buffer between the host controller's command/address busses and memory devices 16. An exemplary block diagram of this arrangement is shown in FIG. 2, in which a data bus 20 (typically 72 bits wide) connects a host controller 22 to MB 18, which in turn interfaces with DRAM 16. The MB is preferably a single JEDEC-compatible MB such as the iMB (isolating Memory Buffer) from Inphi Corporation. Memory systems using a MB of this sort are described, for example, in co-pending U.S. patent application Ser. Nos. 12/267,355 and 12/563,308, which are incorporated herein by reference. When so arranged, the present extended-height DIMM provides greater memory capacity than would a DIMM which complies with the maximum height and number of devices limits referred to above.

The inclusion of a MB on the DIMM is essential to the successful operation of the present extended-height DIMM. If the extended-height DIMM lacked a MB, it would be practically impossible to provide the necessary signal routing to all of the DRAM chips on the DIMM. In addition, it is likely that the loading on the host controller presented by all of the DRAM chips would be prohibitively high. The interface and buffer functionality provided by the use of a MB makes the present extended-height DIMM possible, both in terms of signal routing to the DRAMs and load reduction for the host controller. A MB also enables more ranks to be supported than would otherwise be possible. For example, the memory buffer might be arranged to support up to 8 physical ranks, while appearing to a host controller as if there are no more than 4 logical ranks and 1 physical rank.

In view of the fact that the MB isolates the DRAMs from the host controller, DRAMs no longer need to be located in close proximity to a DIMM's connector edge to meet functional and performance requirements. Without these location restrictions, the size of the DIMM module can be opened to new, larger sizes, which in turn enables more DRAMs to be located on the DIMM. If non-stacked (planar) DRAM chips are used to populate such a DIMM, the memory capacity provided by an extended-height DIMM can be the equivalent of that provided by a standard height DIMM using stacked DRAMs, but at a much cheaper cost. Alternatively, the extended height DIMM can be populated with stacked DRAMs, thereby increasing the memory capacity in comparison with that which can be provided by a standard height DIMM. In either case, the host interface can remain the same as it would with a conventional DIMM, thereby enabling existing systems to take advantage of the extended-height DIMM.

The number of DRAM devices connected to the MB is only limited by the size of the PCB. For example, the current 30×133 mm DDR3 form factor allows 36 locations for DRAM devices. By increasing this to, for example, 56×133 mm, a DIMM can accommodate 72 DRAM devices. The height is only limited by the end application.

FIG. 3 is an illustration of a DIMM 30 in accordance with the present invention. This exemplary implementation includes four rows of DRAM chips 32, each of which includes nine chips. The flow of commands and data between a memory buffer 34 and the DRAM is indicated with lines 36, and the flow of data between memory buffer 34 and the DRAM chips is indicated with lines 38.

An extended-height DIMM as described herein can be used in at least two ways. Since it can accommodate a greater number of DRAMs, an extended-height DIMM can be populated with conventional non-stacked (planar) DRAMs and still provide a memory capacity that would otherwise require the use of stacked DRAMs on a standard DIMM, but at a much lower cost. Alternatively, the extended-height DIMM could be populated with stacked DRAMs, providing even greater memory capacity in comparison with that which can be provided by a standard height DIMM. Most current servers employ a 2 U or 4 U form factor, and can thus accommodate an extended-height DIMM as described herein.

One possible application of the present extended-height DIMM is for DDR3 DIMMs, though the present DIMM might also be used with DRAMs that comply with other standards, including DDR3L and DDR3U RDIMM, UDIMM or LRDIMM JEDEC standards.

The present extended-height DIMM can be populated with either four data lane (×4) or eight data lane (×8) DRAM chips. If ×8 DRAM chips are used, nine chips would be required to interface with a typical 72 bit data bus (typically 64 bits of data and 8 ECC bits). Four rows of nine chips could reside on each side of a 56 mm high extended-height DIMM, and thereby provide up to eight ranks. If ×4 DRAM chips are used, eighteen chips would be needed to interface with a 72 data bit bus. If each row contains nine chips, two rows would be needed, and the DIMM could include up to four ranks. The two rows of nine chips forming a given rank might be arranged to be adjacent to each other on the same side of the DIMM, or not adjacent to each other on the same side of the DIMM, or on opposite sides of the DIMM. Eight data lane (×8) DRAMs might be preferred as they are more common and thus less expensive than an equivalent four data lane DRAM. However, ×4 DRAMs might be preferred since, as twice as many ×4 chips are needed to provide the necessary 72 bits in comparison with ×8 chips, an extended-height DIMM using ×4 DRAMs could potentially provide twice the amount of storage capacity as an extended-height DIMM using ×8 DRAMs.

Another possible embodiment of the present extended height DIMM is illustrated in FIG. 4, which may be employed as a DDR4 DIMM. The DIMM 50 comprises a PCB 52 having an edge connector 54 designed to mate with a respective one of the memory system's slots (not shown). The height 'A' of the PCB is greater than the maximum height imposed by the JEDEC specification governing a DDR4 DIMM. For example, JEDEC document MO-309D (dated Jan. 10, 2014) specifies that the nominal height of a standard DDR4 SDRAM DIMM is to be approximately 31 mm The height of the present extended-height DIMM is greater than 31 mm, and is preferably 56 mm (though other heights might also be used). The DIMM 50 uses the same connector arrangement as is found on regular DDR4 UDIMMs, RDIMMs and LRDIMMs.

A plurality of memory devices 56 reside on PCB 52, with the number of devices exceeding the maximum number of devices specified in the applicable governing standard. For example, the DDR4 SDRAM DIMM can accommodate two rows of memory devices (typically DRAM chips) on each side of the PCB, with each row holding a maximum of 9 devices, for a maximum of 36 devices. In contrast, the present extended-height DIMM is preferably arranged to accommodate more than two rows of devices—preferably four rows—on each side of the PCB. Assuming that the DRAMs are sized such that nine devices fit in each row, and there are four rows on each side, the extended-height DIMM can accommodate a maximum of 72 devices.

In the embodiment described above, a MB was used to buffer data bytes being written to or read from DRAM by a host controller, as well as operate as a buffer between the host controller's command/address busses and memory devices. For the extended-height DIMM shown in FIG. 4, the function of a MB is provided by a register control device (RCD) 58 and data buffer (DB) devices 60 on PCB 52, which are used to buffer data bytes being written to or read from memory devices 56 by a host controller, as well as operate as a buffer between the host controller's command/address busses and memory devices 56. The RCD and DB devices are referred to as a "1+9 chip set".

Figure 5:
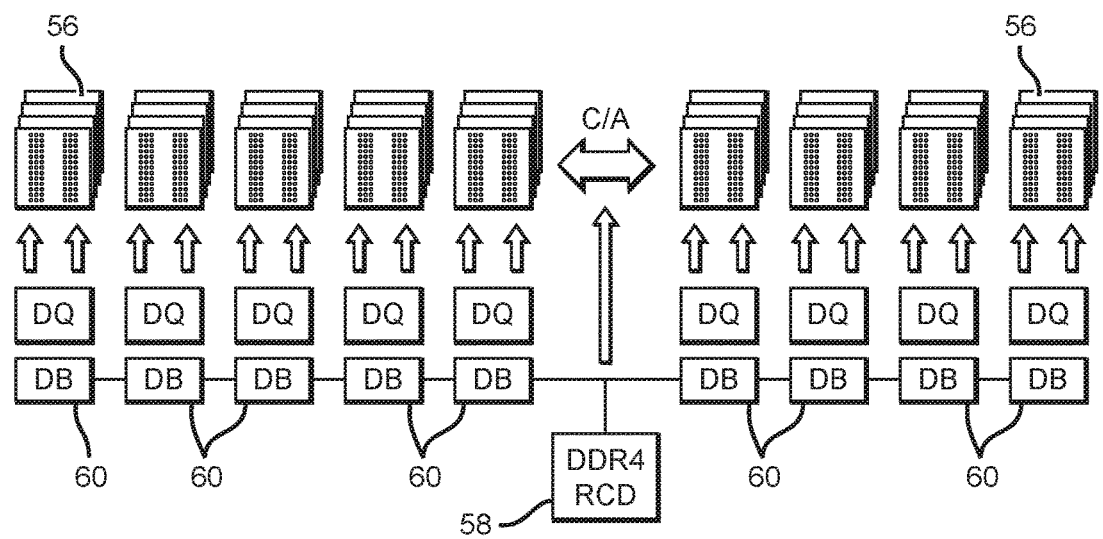
FIG. 5 is a block diagram of another embodiment of an extended-height DIMM in accordance with the present invention.

An exemplary block diagram of this arrangement is shown in FIG. 5, in which a command/address bus (C/A) connects a host controller (not shown) to RCD 58, which in turn interfaces with DB devices 60 and DRAM 56. The signals carried by the C/A bus typically include CS, DKE, ODT, Address, WR, and RD. The RCD operates to buffer the Clk and C/A signals, as well as to issue commands to the DB devices. The RCD is preferably a iDDR4RCD2-GS01 and the DB devices are preferably iDDR4DB2-GS02 from Inphi Corporation. When so arranged, the present extended-height DIMM provides greater memory capacity than would a DIMM which complies with the maximum height and number of devices limits referred to above.

The RCD communicates with the DB devices to facilitate DIMM operations. Each DB device 60 preferably communicates with two DRAM devices 56, with each DB device containing 2 sets of 4 bi-directional data signal (DQ) lines. The DB devices follow RCD commands, and serve to buffer data from the host to DRAM and/or from DRAM to the host. The DBs retime the data signal from the host to the DRAM, enabling faster performance.

The inclusion of the RCD and DB devices on DIMM 50 is essential to the successful operation of the present extended-height DIMM. If the extended-height DIMM lacked these devices, it would be practically impossible to provide the necessary signal routing to all of the DRAM chips on the DIMM. In addition, it is likely that the loading on the host controller presented by all of the DRAM chips would be prohibitively high. The interface and buffer functionality provided by the use of RCD and DB devices makes the present extended-height DIMM possible, both in terms of signal routing to the DRAMs and load reduction for the host controller.

The extended height DIMM shown in FIGS. 4 and 5 enables the use of planar DDR4 ×4 DRAM, versus more expensive ×4 DDP DRAM. The DIMM can support up to 4 physical ranks, and can accommodate both DDR4 and DDR4E configurations. The DIMM can operate at up to DDR4 3200 speed.

In view of the fact that the RCD and DB devices isolate the DRAMs from the host controller, DRAMs no longer need to be located in close proximity to a DIMM's connector edge to meet functional and performance requirements. Without these location restrictions, the size of the DIMM module can be opened to new, larger sizes, which in turn enables more DRAMs to be located on the DIMM. If non-stacked (planar) DRAM chips are used to populate such a DIMM, the memory capacity provided by an extended-height DIMM can be the equivalent of that provided by a standard height DIMM using stacked DRAMs, but at a much cheaper cost. Alternatively, the extended height DIMM can be populated with stacked DRAMs, thereby increasing the memory capacity in comparison with that which can be provided by a standard height DIMM. In either case, the host interface can remain the same as it would with a conventional DIMM, thereby enabling existing systems to take advantage of the extended-height DIMM.

The number of DRAM devices connected to the RCD and DB devices is only limited by the size of the PCB. For example, the current 30×133 mm DDR4 form factor allows 36 locations for DRAM devices. By increasing this to, for example, 56×133 mm, a DIMM can accommodate 72 DRAM devices. The height is only limited by the end application.

An extended-height DIMM as described herein can be used in at least two ways. Since it can accommodate a greater number of DRAMs, an extended-height DIMM can be populated with conventional non-stacked (planar) DRAMs and still provide a memory capacity that would otherwise require the use of stacked DRAMs on a standard DIMM, but at a much lower cost. Alternatively, the extended-height DIMM could be populated with stacked DRAMs, providing even greater memory capacity in comparison with that which can be provided by a standard height DIMM. Most current servers employ a 2 U or 4 U form factor, and can thus accommodate an extended-height DIMM as described herein.

One possible application of the extended-height DIMM shown in FIGS. 4 and 5 is for DDR4 DIMMs, though the present DIMM might also be used with DRAMs that comply with other standards, including DDR4 UDIMMs, RDIMMs and LRDIMMs JEDEC standards.

The embodiments of the invention described herein are exemplary and numerous modifications, variations and rearrangements can be readily envisioned to achieve substantially equivalent results, all of which are intended to be embraced within the spirit and scope of the invention as defined in the appended claims.

I claim:

1. An extended-height DIMM for use in a memory system having slots designed to receive DIMMs that comply with a JEDEC standard that specifies a maximum height for a DIMM and a maximum number of devices allowed to reside on a DIMM, the extended-height DIMM comprising:
    a printed circuit board (PCB) having an edge connector designed to mate with a respective one of the slots, a height of said PCB being greater than said maximum height;
    a plurality of memory devices on said PCB which exceeds said maximum number of devices;
    a register control device (RCD) and data buffer (DB) devices on said PCB and arranged to operate as an interface between a host controller's data and command/address busses and all of the plurality of memory devices;
    such that said extended-height DIMM provides greater memory capacity than would a DIMM which complies with said maximum height and said maximum number of devices in the JEDEC standard.

2. The extended-height DIMM of claim 1, wherein said maximum height is approximately 31 mm and said PCB has a height of approximately 56 mm.

3. The extended-height DIMM of claim 1, wherein said maximum number of devices is 36 and said PCB can accommodate as many as 72 devices.

4. The extended-height DIMM of claim 1, wherein said memory devices of the plurality of memory devices are planar DDR4 ×4 DRAMs.

5. The extended-height DIMM of claim 4, wherein a greater number of planar DDR4 ×4 DRAMs than the maximum number of devices accommodated by said extended-height DIMM enable said extended-height DIMM to provide a memory capacity comparable to that of a DIMM on which stacked DRAMs reside and which is in compliance with said JEDEC standard.

6. The extended-height DIMM of claim 1, wherein said memory devices of the plurality of memory devices are stacked DRAMs.

7. The extended-height DIMM of claim 1, wherein said slots are designed to receive DIMMs in compliance with the DDR4 UDIMMs, RDIMMs and LRDIMMs JEDEC standards.

8. The extended-height DIMM of claim 1, wherein said one of the DB devices is a JEDEC-compatible memory buffer.

9. The extended-height DIMM of claim 1, wherein said extended-height DIMM is arranged to support up to 4 physical ranks.

10. The extended-height DIMM of claim 1, wherein said extended-height DIMM is arranged to operate at up to DDR4 3200 speed.

11. The extended-height DIMM of claim 1, wherein said extended-height DIMM comprises one RCD and 9 DB devices.

12. The extended-height DIMM of claim 1, wherein said RCD is arranged to buffer clock and command and address signals from a host controller, and to issue commands to said DB devices.

13. The extended-height DIMM of claim 1, wherein said memory devices of the plurality of memory devices are DRAMs, wherein said DB devices are arranged to retime data signals from a host controller to the DRAMs.

14. The extended-height DIMM of claim 1, wherein said memory devices of the plurality of memory devices are DRAMs, and wherein each of said DB devices comprises 2 sets of 4 bi-directional data signal (DQ) lines and said DB devices are arranged to buffer data between a host controller and the DRAMs.

15. The extended-height DIMM of claim 14, wherein each of said DB devices is arranged to communicate with two DRAMs.

* * * * *